United States Patent [19]

Nguyen et al.

[11] Patent Number: 5,839,062
[45] Date of Patent: Nov. 17, 1998

[54] MIXING, MODULATION AND DEMODULATION VIA ELECTROMECHANICAL RESONATORS

[75] Inventors: Clark Tu-Cuong Nguyen, Berkeley; Vadim Gutnik, Irvine; Roger T. Howe, Lafayette, all of Calif.

[73] Assignee: The Regents of the University of California, Oakland, Calif.

[21] Appl. No.: 210,199

[22] Filed: Mar. 18, 1994

[51] Int. Cl.$^6$ ..................................................... H04B 1/26
[52] U.S. Cl. .......................... 455/323; 455/303; 455/333; 332/117; 333/193
[58] Field of Search ...................................... 329/333, 344; 332/117; 333/193, 194, 196, 197, 186; 310/313 B, 316; 455/323, 325, 330, 333, 307, 319

[56] References Cited

U.S. PATENT DOCUMENTS

| | | | |
|---|---|---|---|
| 1,719,484 | 7/1929 | Norton | 179/15 |
| 1,796,117 | 3/1931 | Nicolson | 332/175 |
| 2,660,709 | 11/1953 | Hampshire et al. | 332/175 |
| 3,247,470 | 4/1966 | Read | 332/167 |
| 3,253,166 | 5/1966 | Osial et al. | 329/328 |
| 3,490,056 | 1/1970 | Warren et al. | 333/186 |
| 3,517,349 | 6/1970 | Engeler et al. | 333/186 |
| 3,626,309 | 12/1971 | Knowles | 329/328 |
| 3,683,213 | 8/1972 | Staudte | 310/9.6 |

(List continued on next page.)

FOREIGN PATENT DOCUMENTS 014240  6/1994  WIPO  ..................................... 333/186

OTHER PUBLICATIONS

C. T.–C. Nguyen, "Electromechanical Characterization of Microresonators for Circuit Applications," M.S. Report, Dept. of Electrical Engineering and Computer Sciences, University of California at Berkeley, Apr. 1991.

L. Lin et al., "Microelectromechanical signal processors," US Patent Application Serial No. 07/990,582, filed Dec. 11, 1992.

C. T.–C. Nguyen et al., "Q–controlled microresonators and tunable electronic filters utilizing such resonators," US. Patent Application Serial No. 07/989,396 filed Dec. 11, 1992.

C. T.–C. Nguyen et al., "Quality Factor Control for Micromechanical Resonators," *Technical Digest,* IEEE International Electron Devices Meeting, San Francisco, California, Dec. 13–16, 1992, pp. 505–508.

L. Lin et al., "Micro Electromechanical Filters for Signal Processing," *Technical Digest,* IEEE Micro Electromechanical Systems Workshop, Travemünde, Germany, pp. 226–231, Feb. 4–7, 1992.

B.–S. Song et al., "A CMOS double–heterodyne FM receiver," *IEEE J. Solid–State Circuits,* vol. SC–21, pp. 916–923, Dec. 1986.

W Yun et al., "Surface micromachined, digitally force–balanced accelerometer with integrated CMOS detection circuitry," *Technical Digest,* IEEE Solid–State Sensor and Actuator Workshop, Jun. 22–25, 1992, pp. 126–131.

W.C. Tang et al., "Laterally driven polysilicon resonant microstructures," *Sensors and Actuators,* vol. 20, pp. 25–32, 1989.

*Primary Examiner*—Edward F. Urban
*Attorney, Agent, or Firm*—Fish & Richardson P.C.

[57] ABSTRACT

Mixing, modulation and demodulation using the nonlinear properties of microelectromechanical resonators and filters are described. Mixing followed by filtering is implemented using microelectromechanical filters with nonlinear input transducers. AM modulation is implemented by passing a carrier signal through the output transducer of a microelectromechanical filter. FM and FSK demodulation is accomplished using parallel banks of microelectromechanical filters. The invention can be implemented using integrated circuit technology.

15 Claims, 19 Drawing Sheets

U.S. PATENT DOCUMENTS

| | | |
|---|---|---|
| 3,961,288 | 6/1976 | Gordy . |
| 3,983,514 | 9/1976 | Coussot . |
| 4,100,506 | 7/1978 | Ernyei .................................. 333/197 |
| 4,137,511 | 1/1979 | Jones ...................................... 333/71 |
| 4,191,933 | 3/1980 | Montress et al. ..................... 333/151 |
| 4,207,546 | 6/1980 | Grudkowski ......................... 333/196 |
| 4,328,473 | 5/1982 | Montress et al. ..................... 333/196 |
| 4,543,547 | 9/1985 | Picquendar et al. .................. 329/300 |
| 5,025,346 | 6/1991 | Tang et al. ............................ 361/283 |
| 5,223,762 | 6/1993 | Masaie et al. ........................ 333/195 |
| 5,265,267 | 11/1993 | Martin et al. ......................... 333/333 |
| 5,329,319 | 7/1994 | Sgrignoli .............................. 455/193 |
| 5,410,742 | 4/1995 | Yajima .................................. 455/316 |
| 5,530,410 | 6/1996 | Chu ...................................... 333/153 |

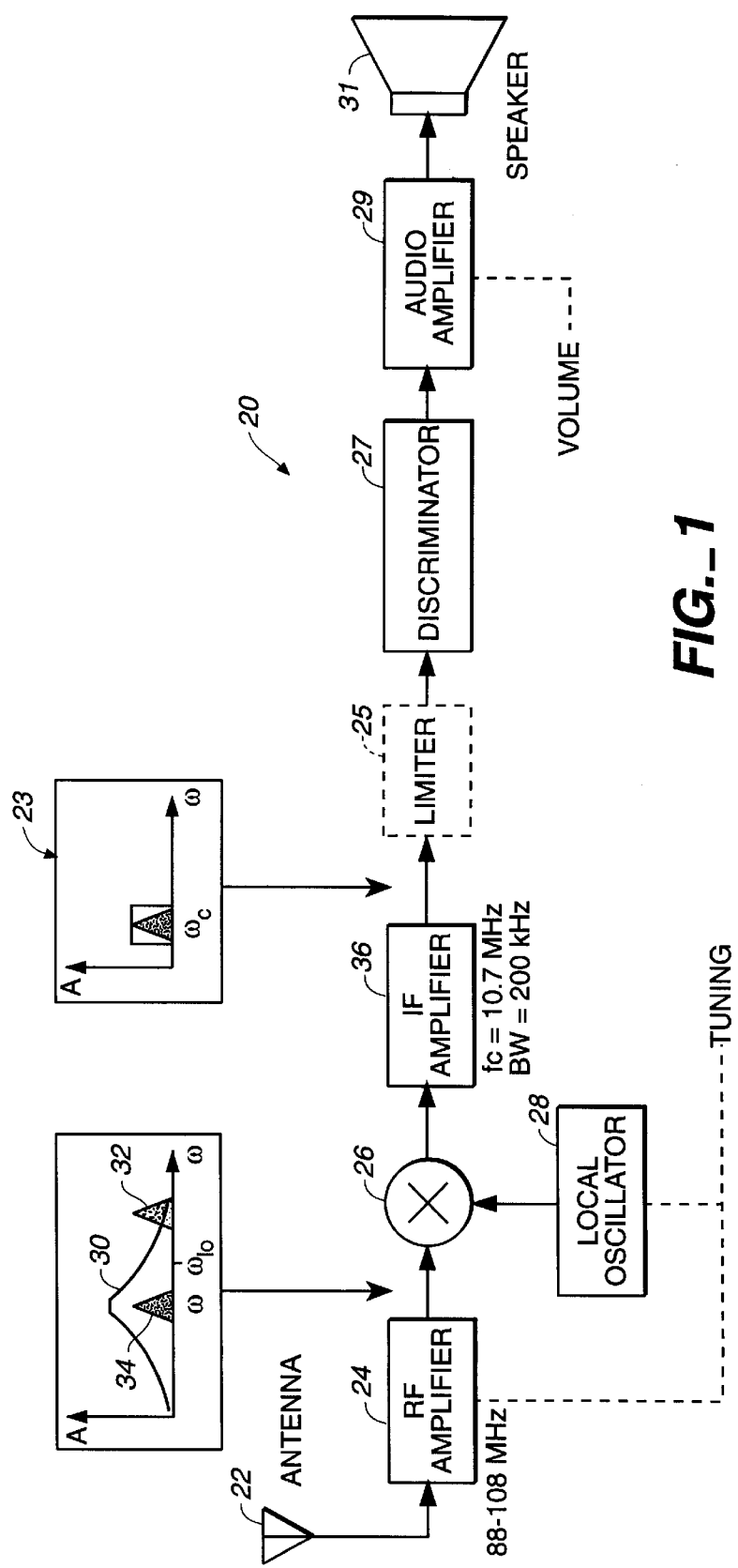
FIG._1

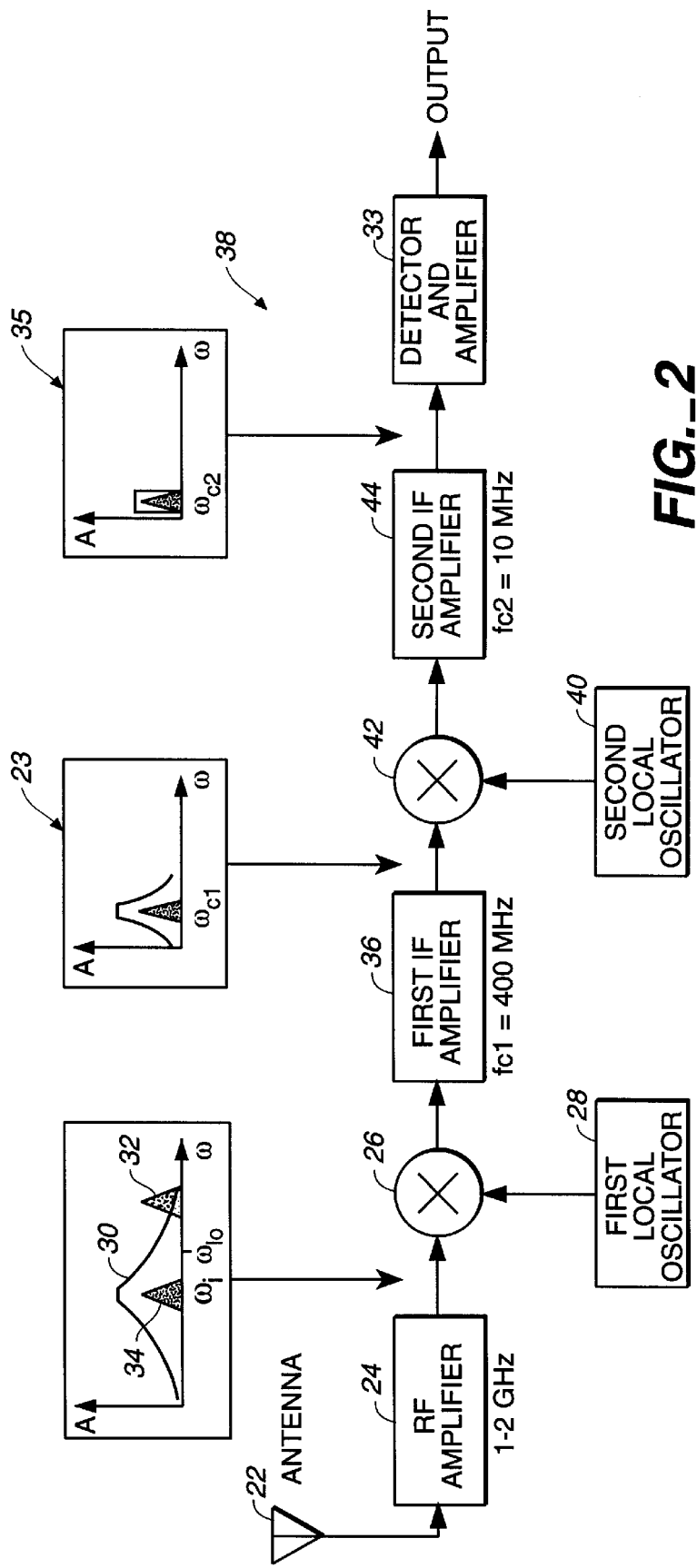
FIG._2

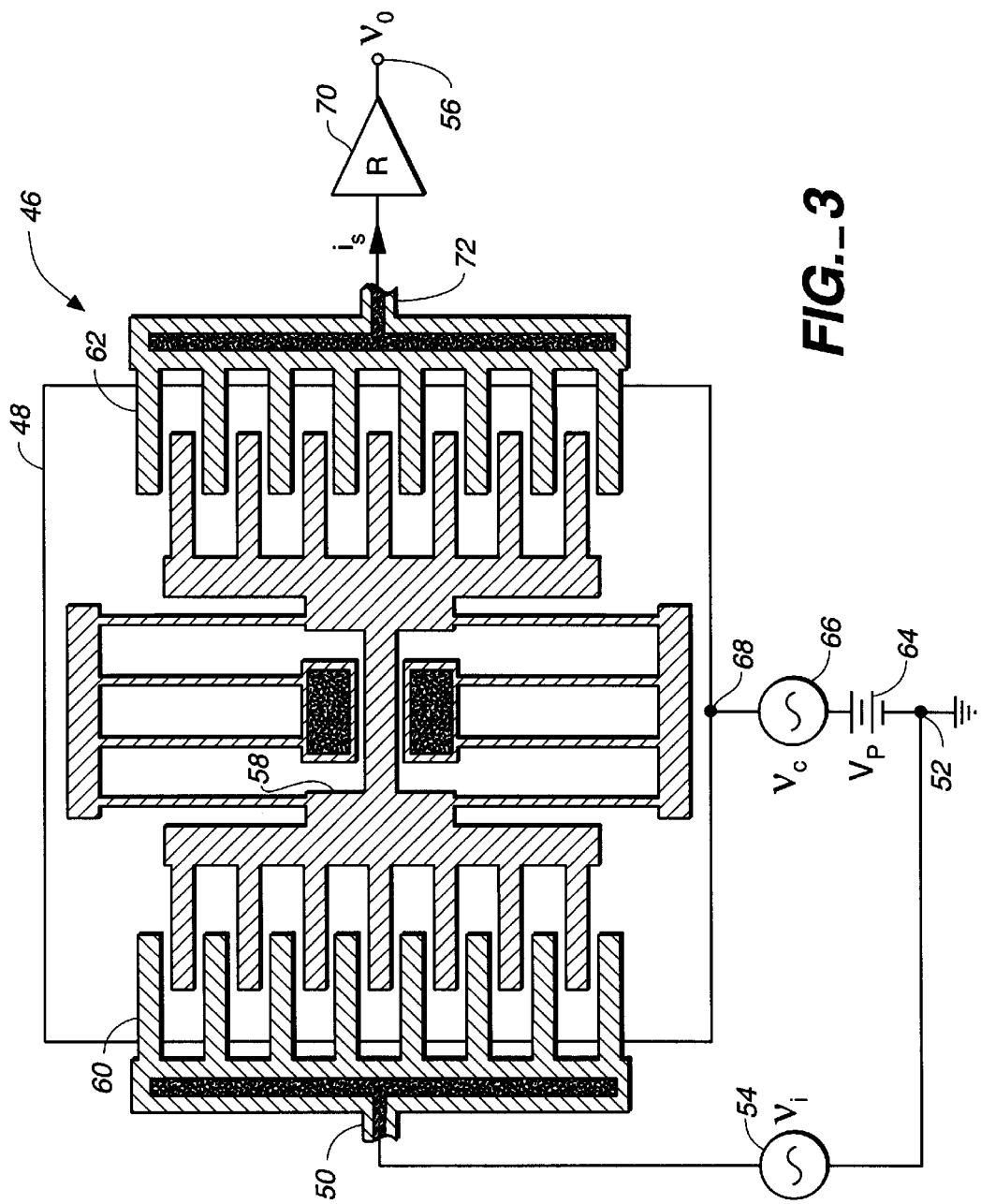
FIG._3

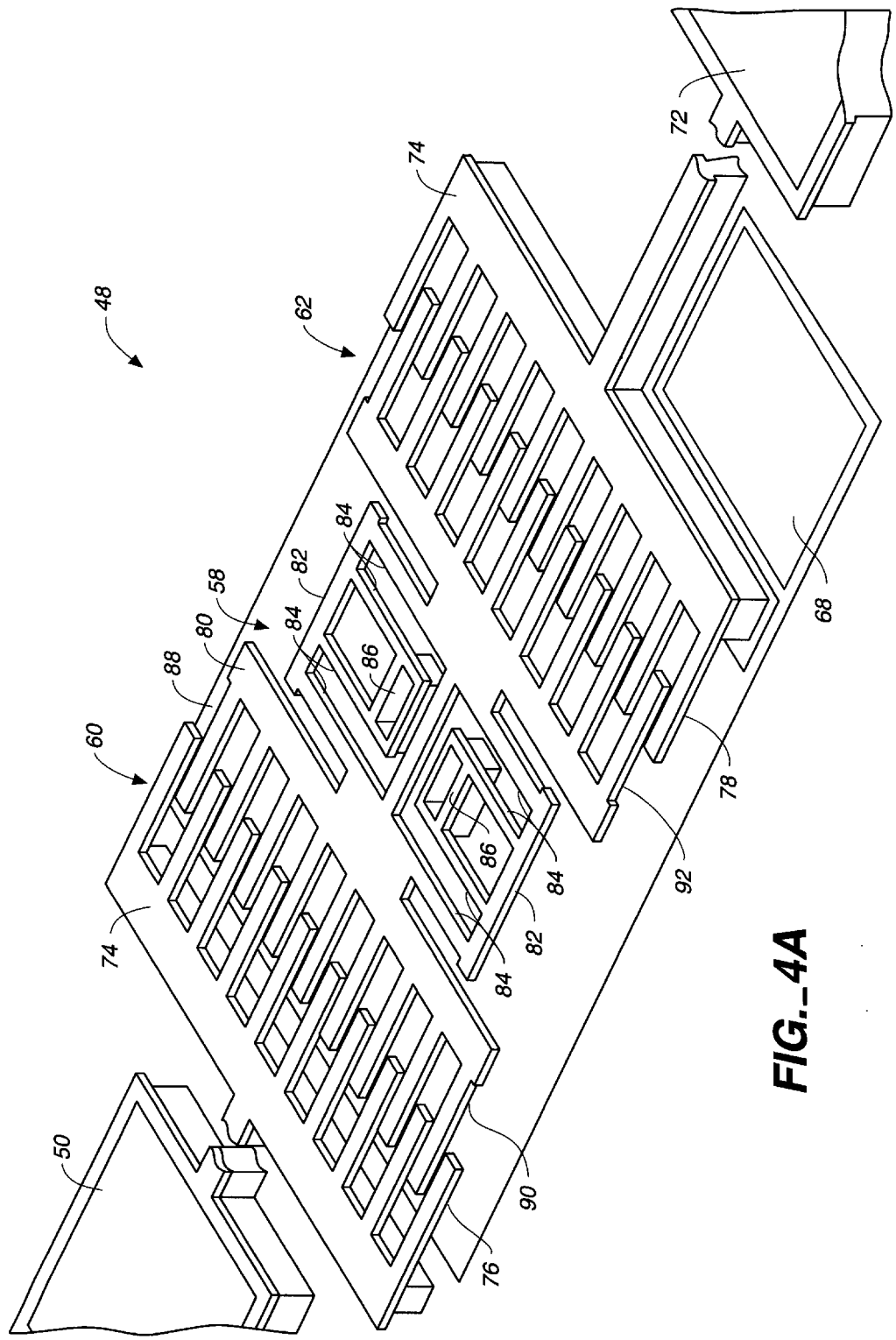
FIG._4A

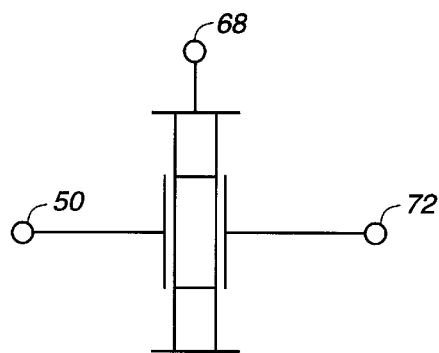
FIG._4B
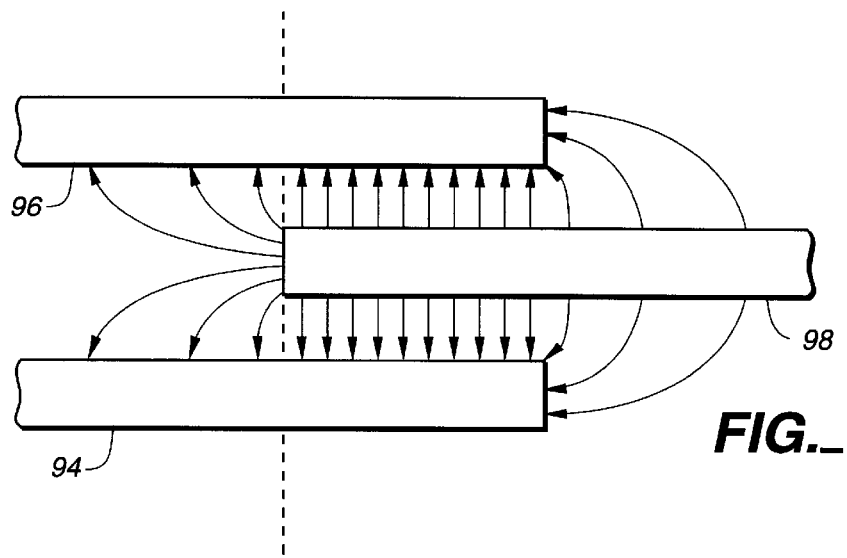
FIG._5A
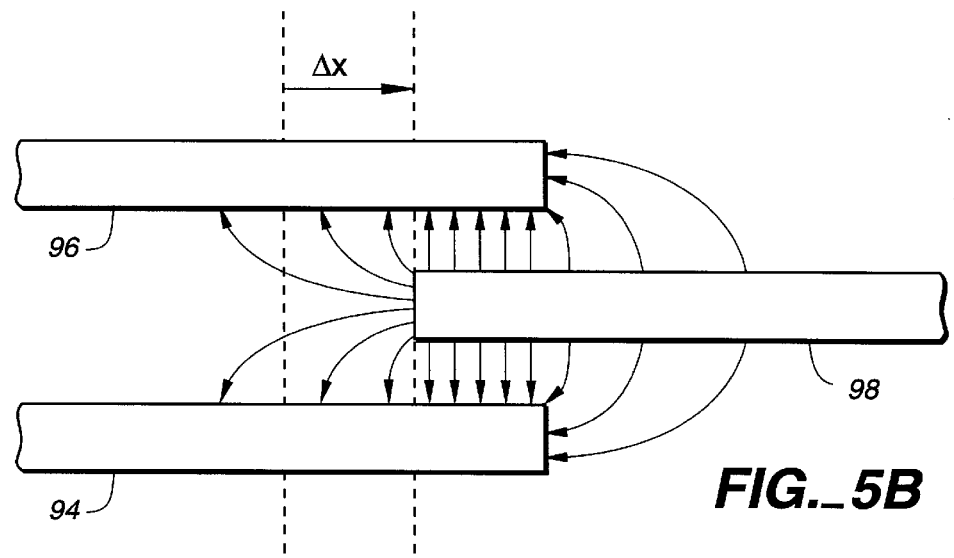
FIG._5B

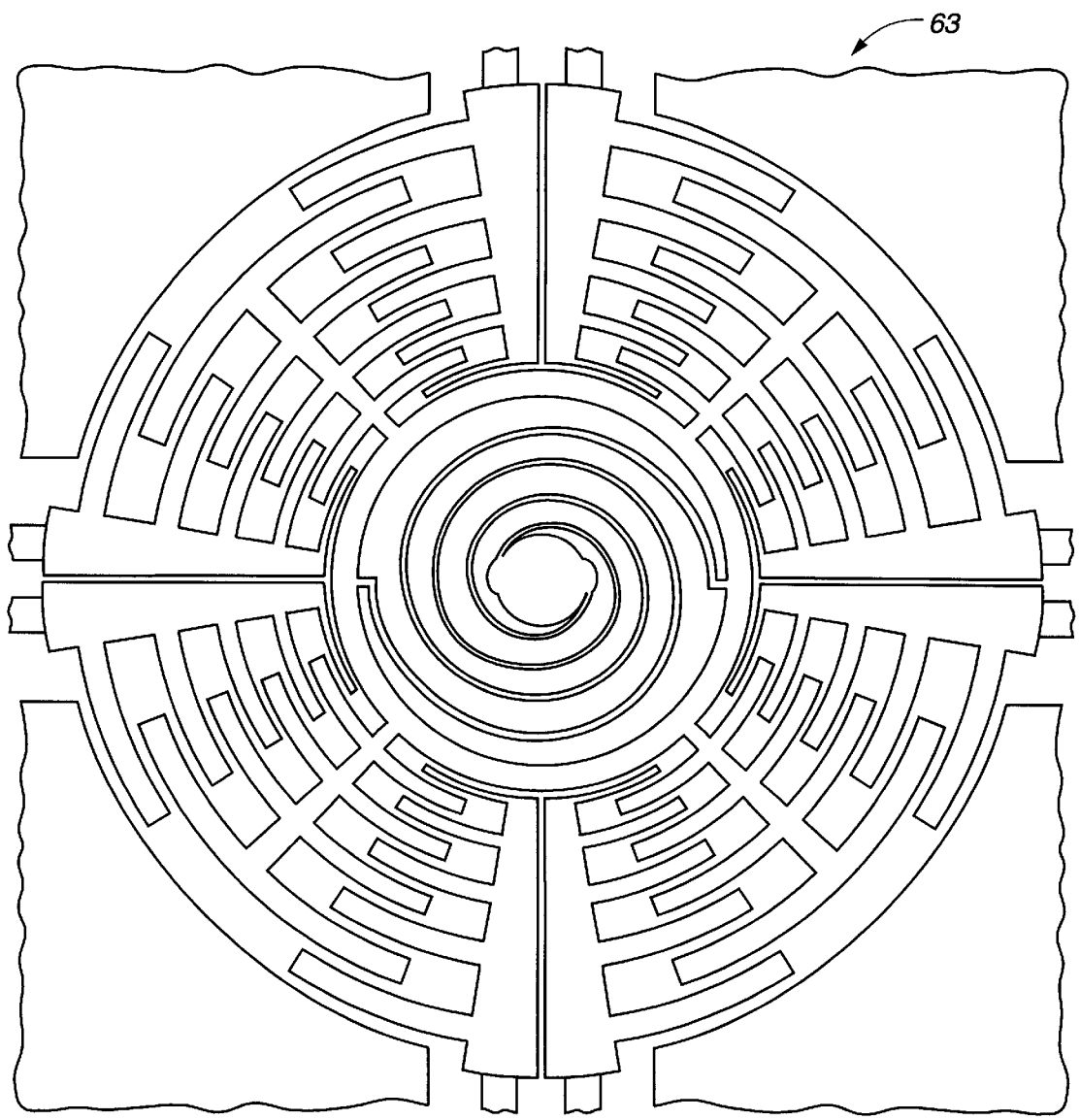
FIG._6
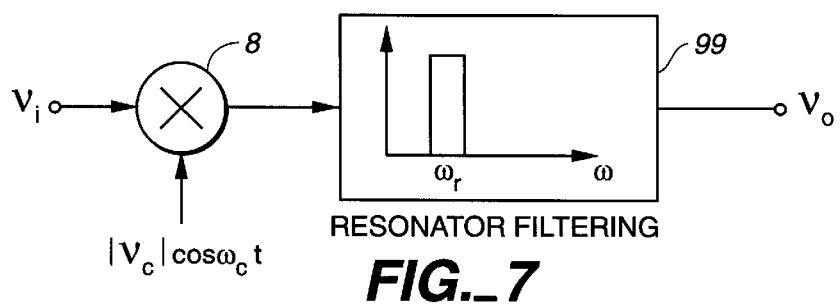
FIG._7

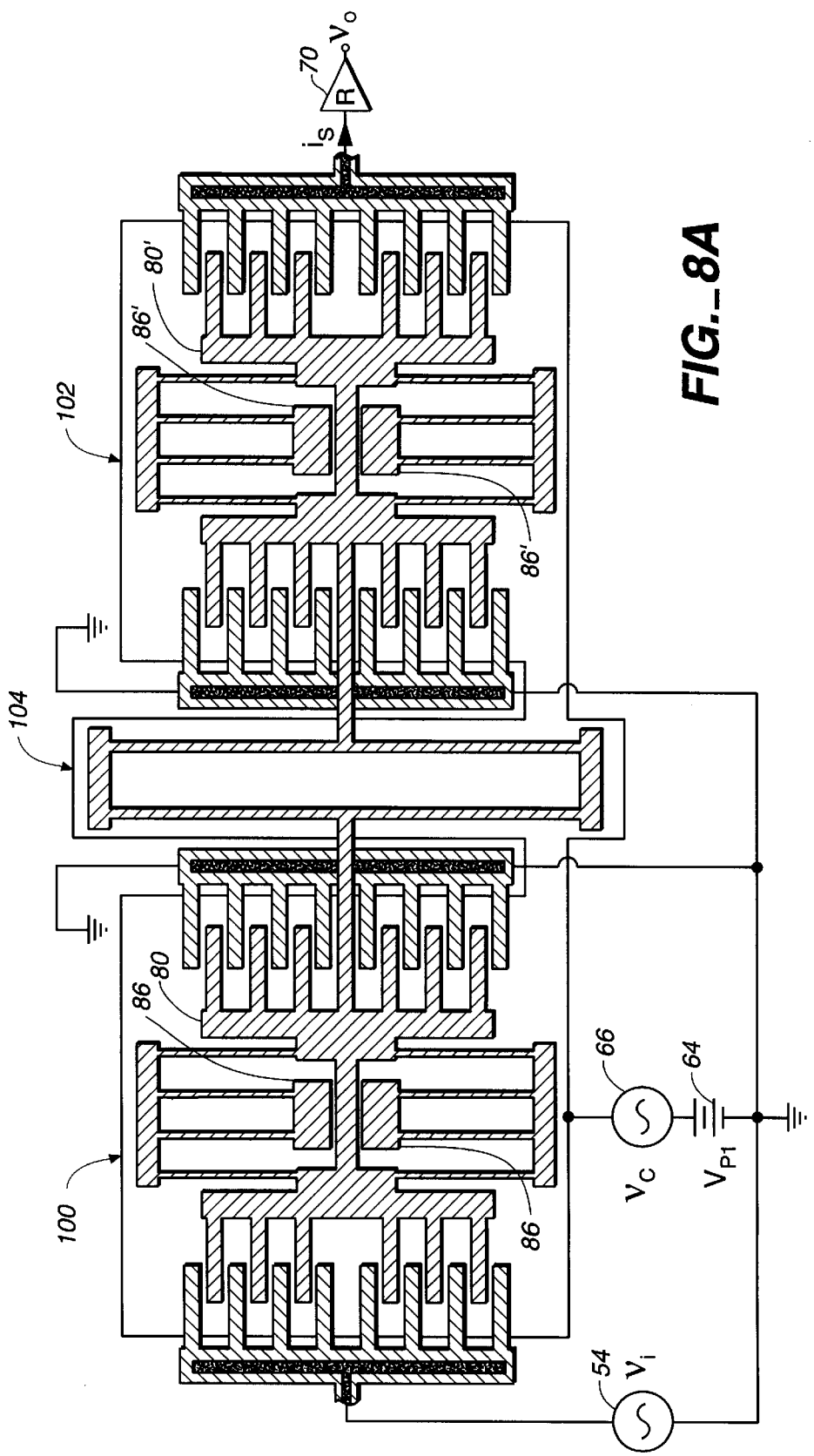
FIG._8A

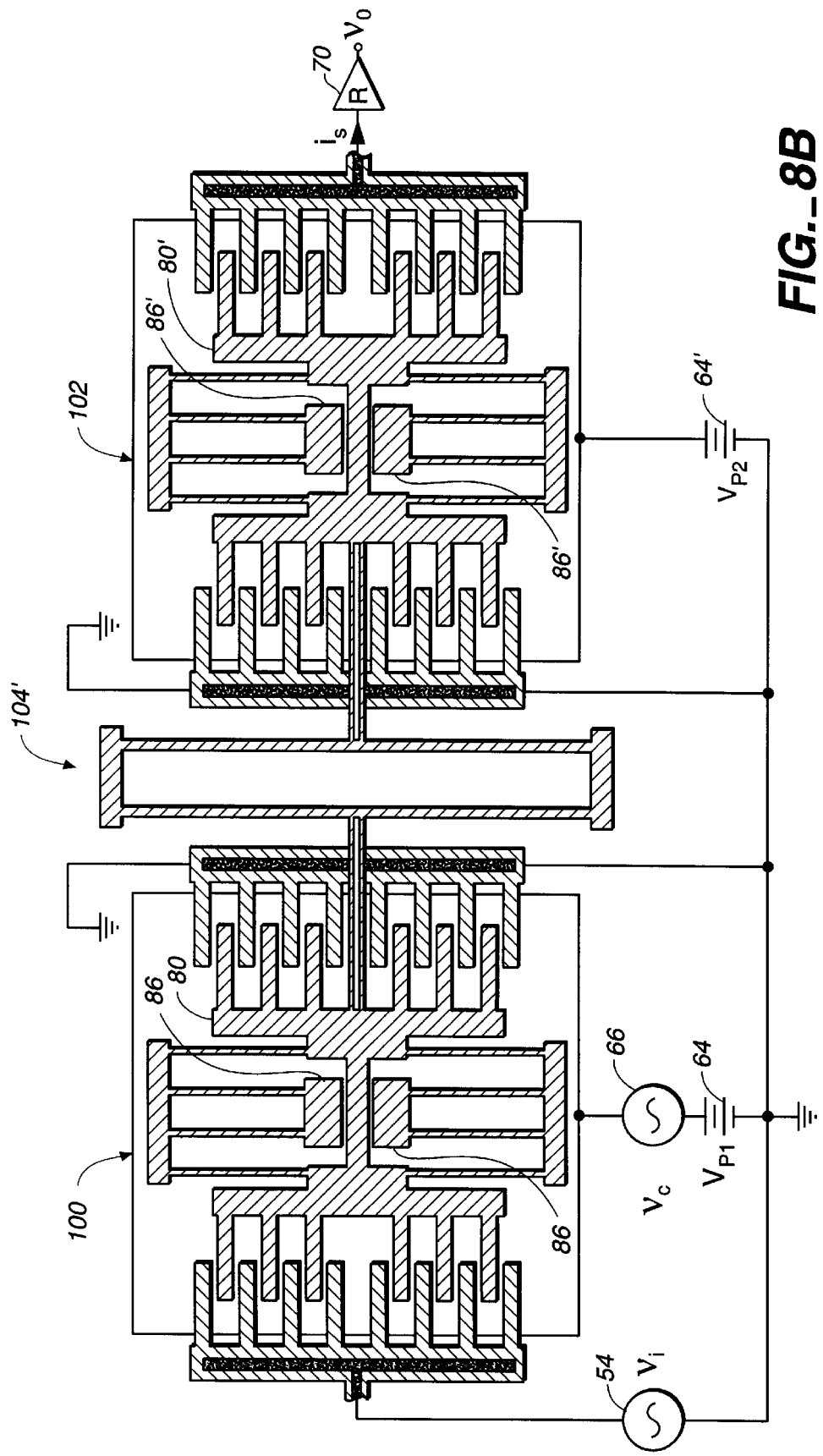
FIG._8B

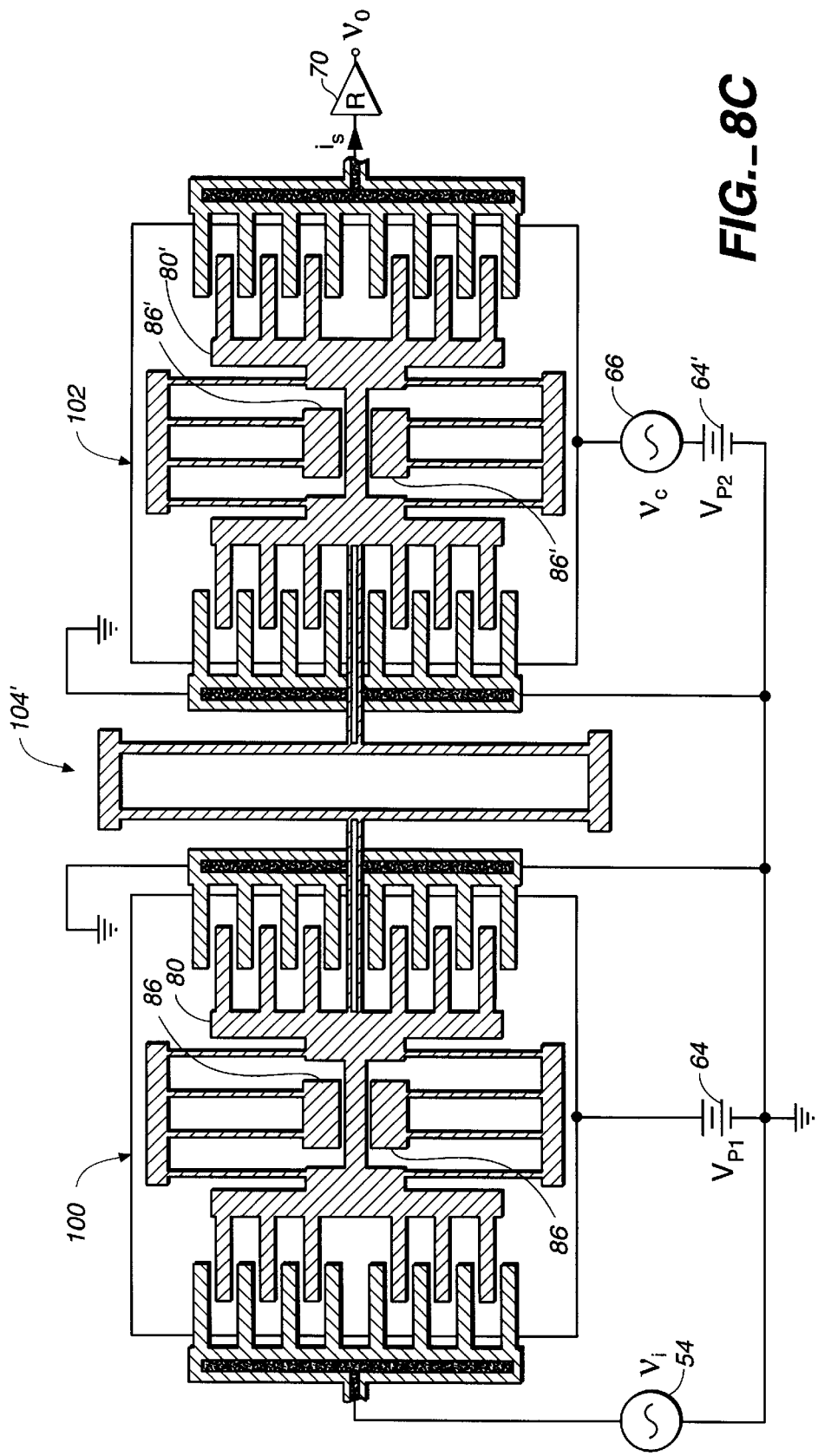
FIG._8C

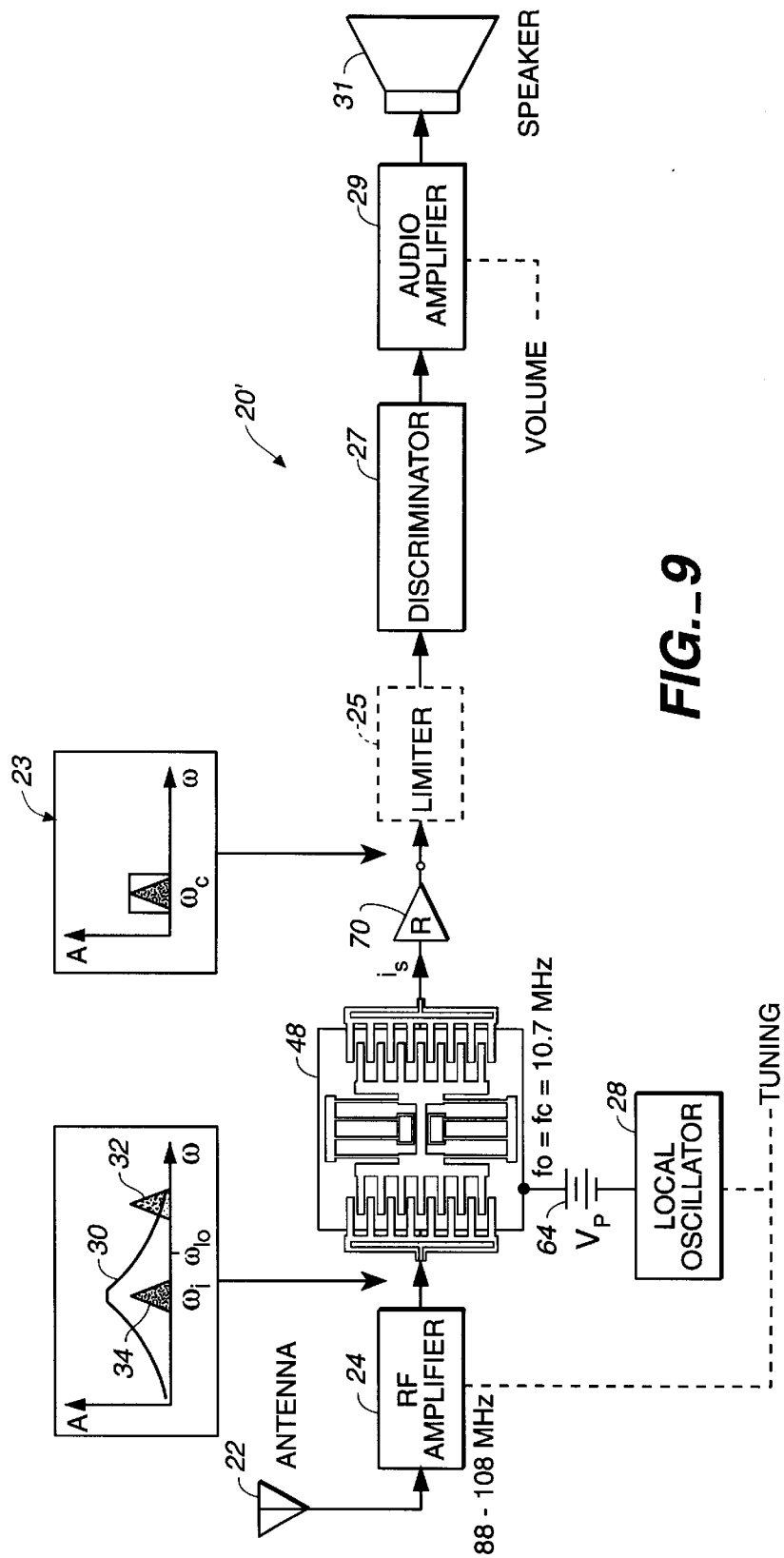
FIG._9

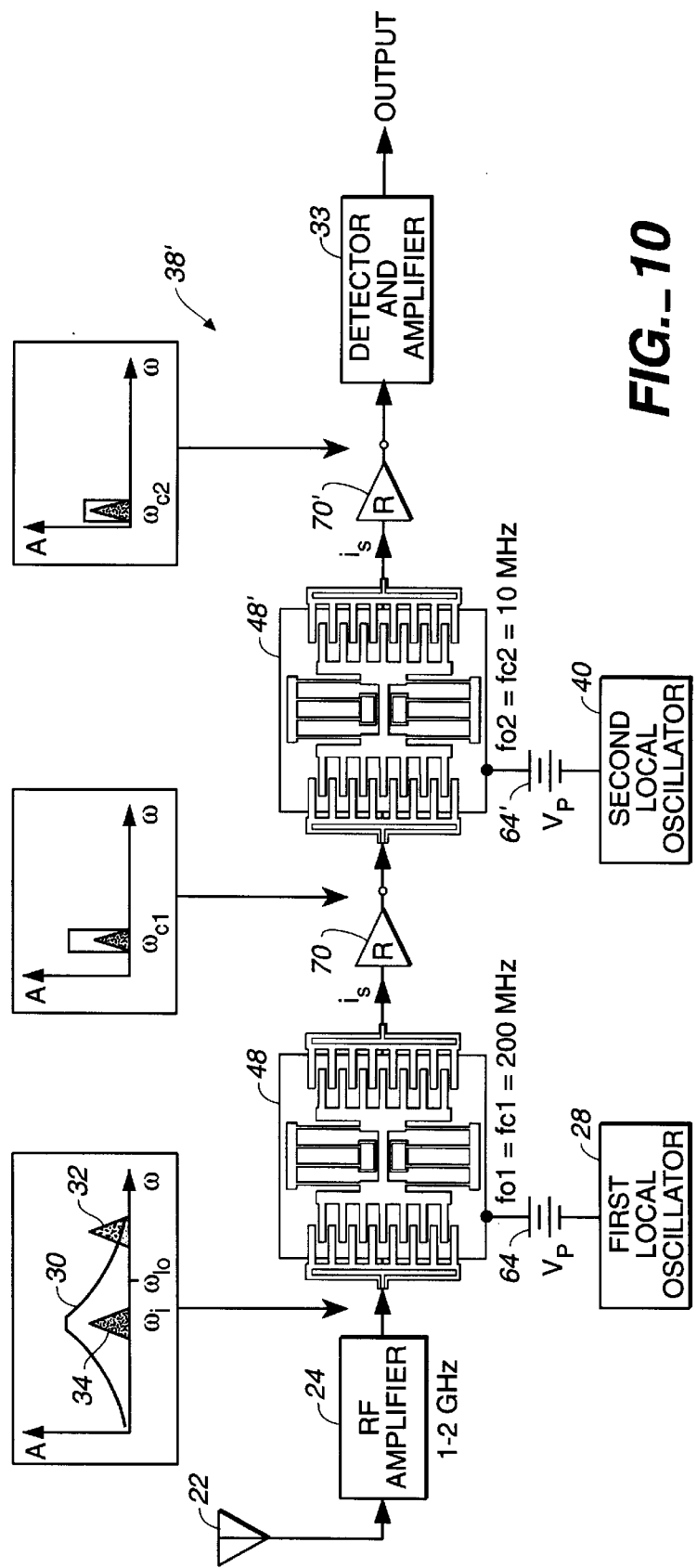
FIG._10

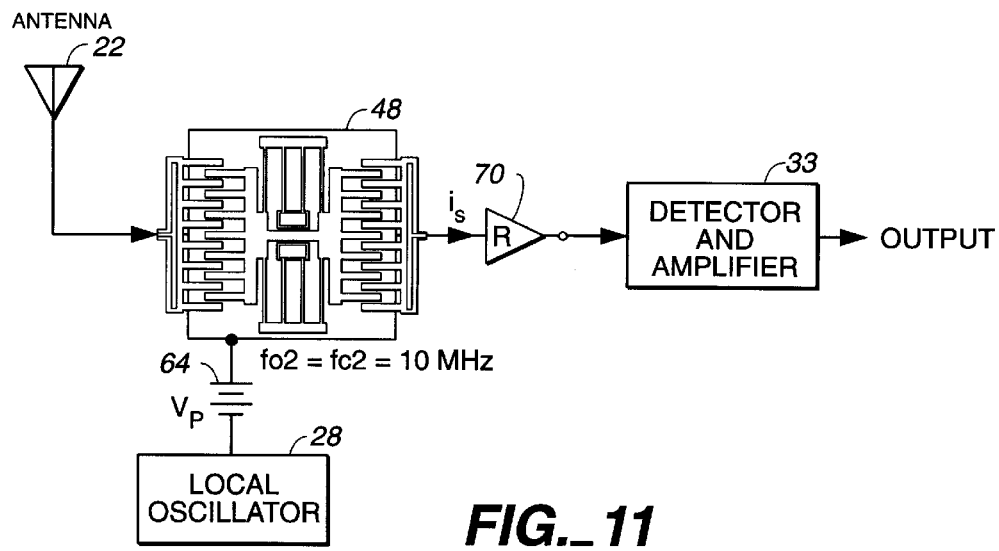
FIG._11
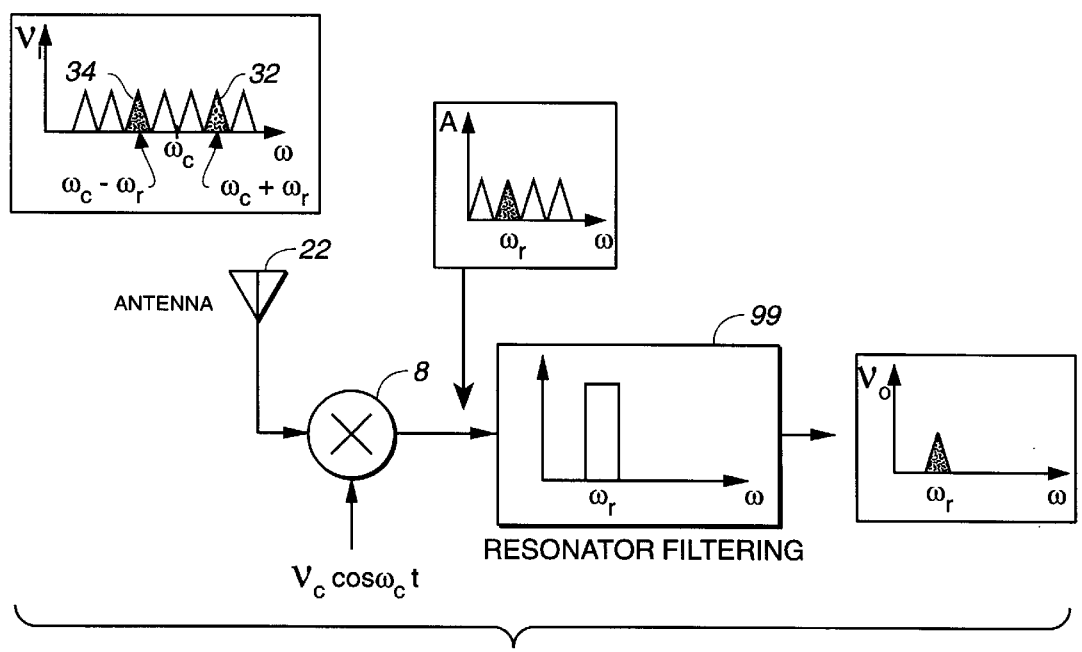
FIG._12

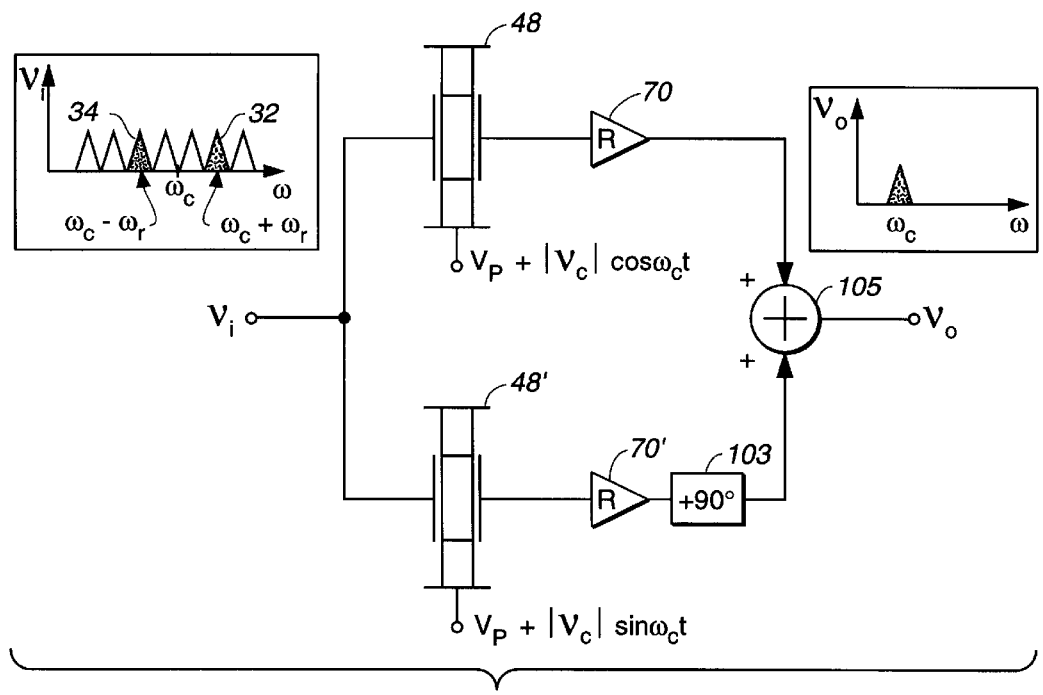
FIG._13
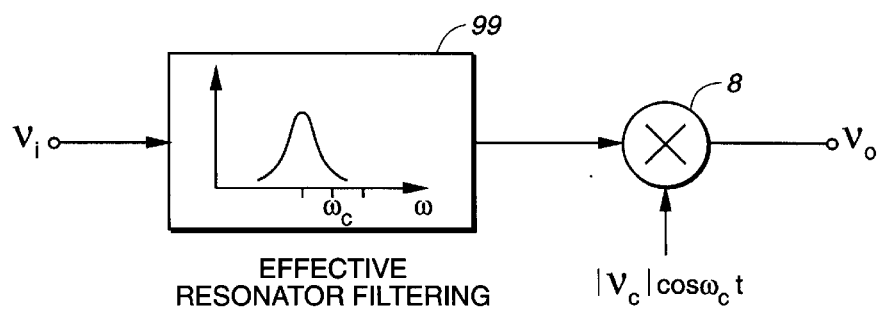
FIG._14

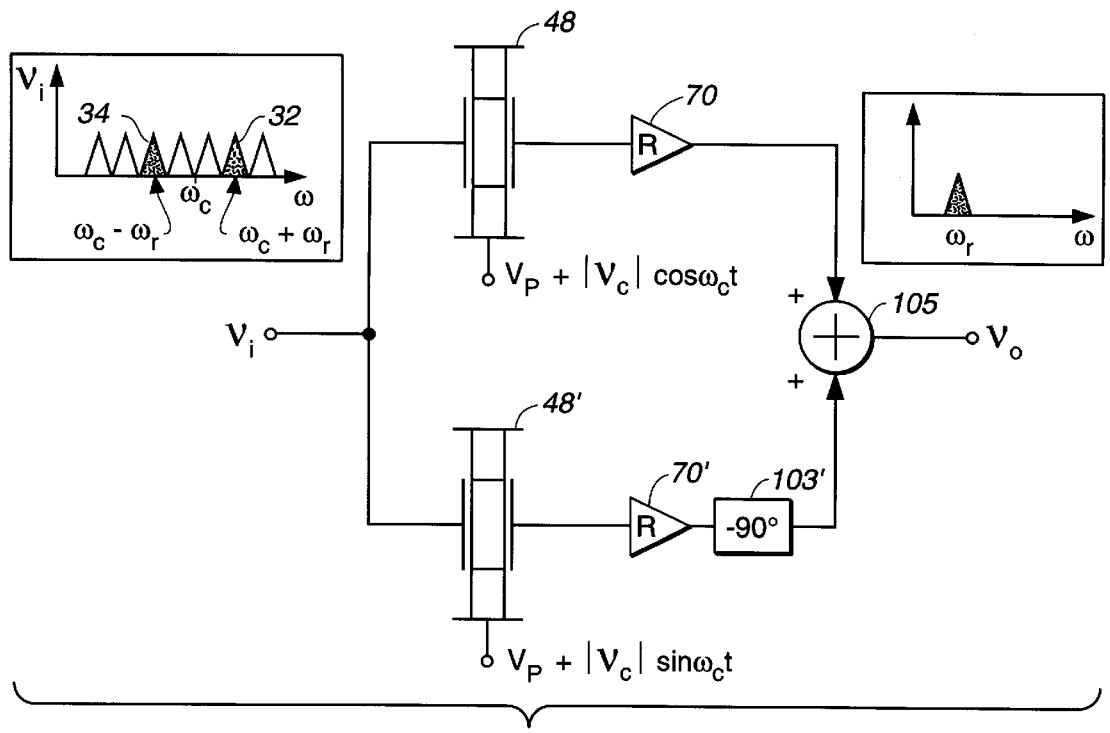
FIG._15A
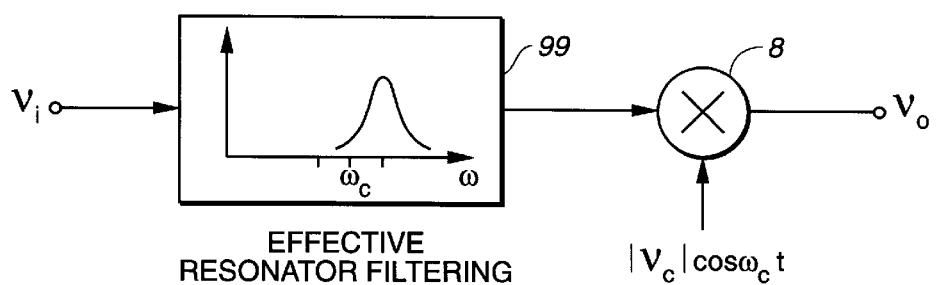
FIG._15B

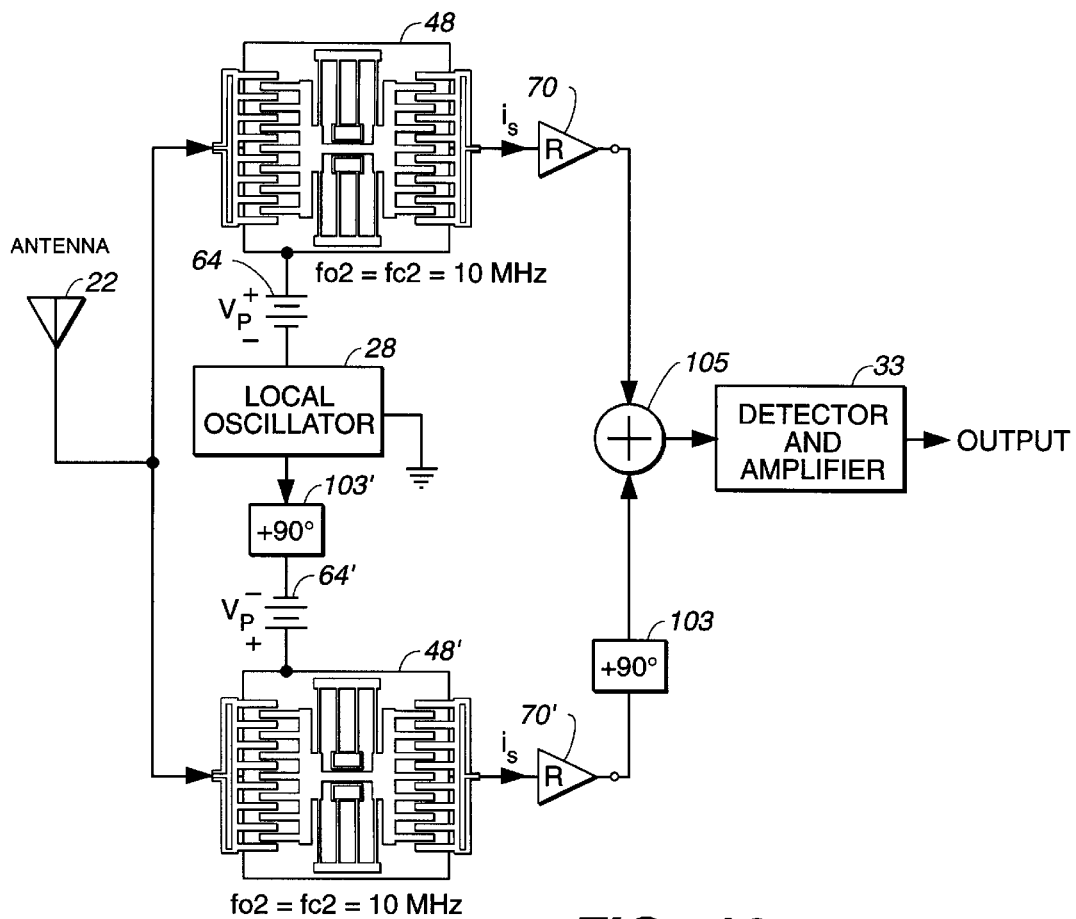
FIG._16

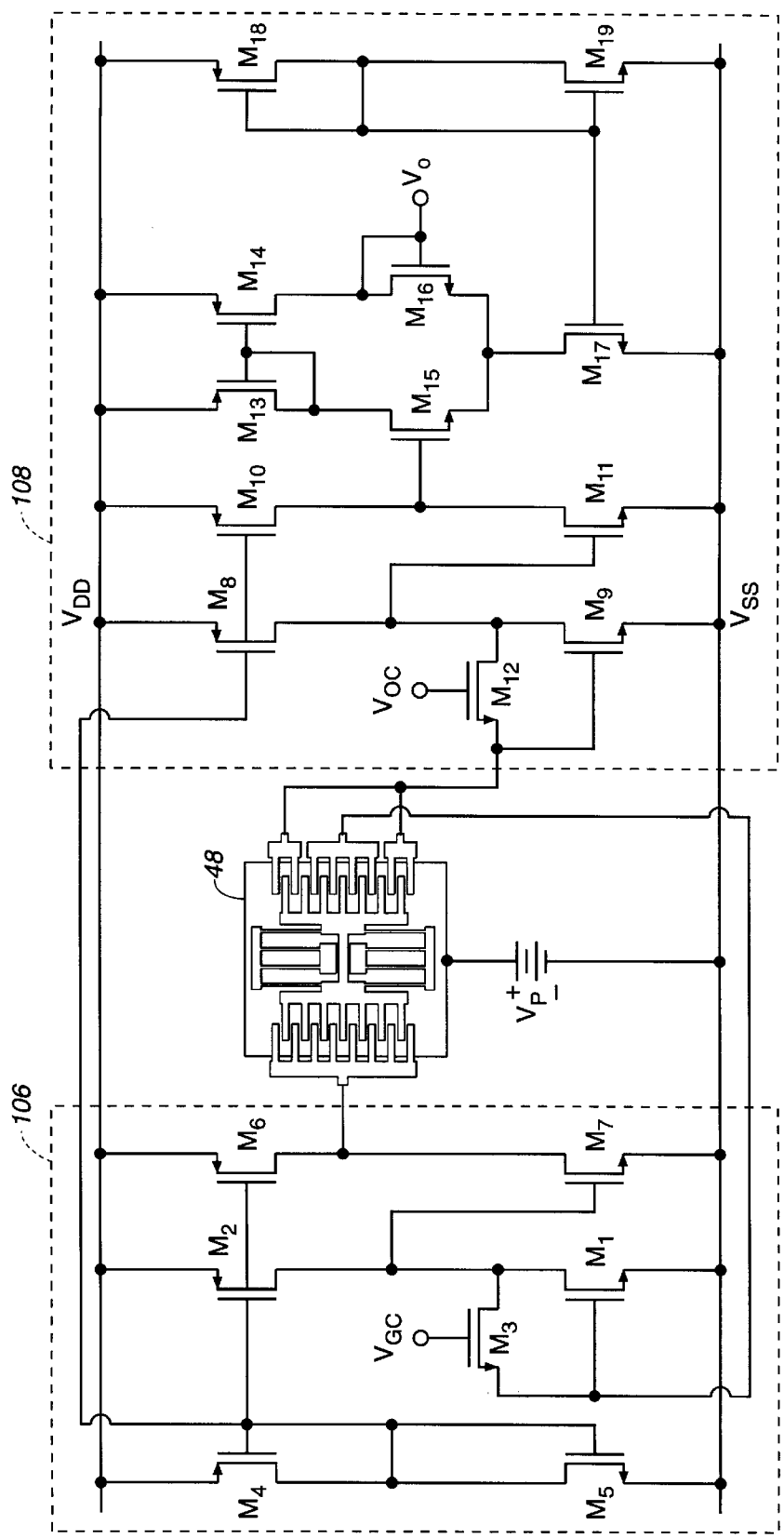
FIG._17

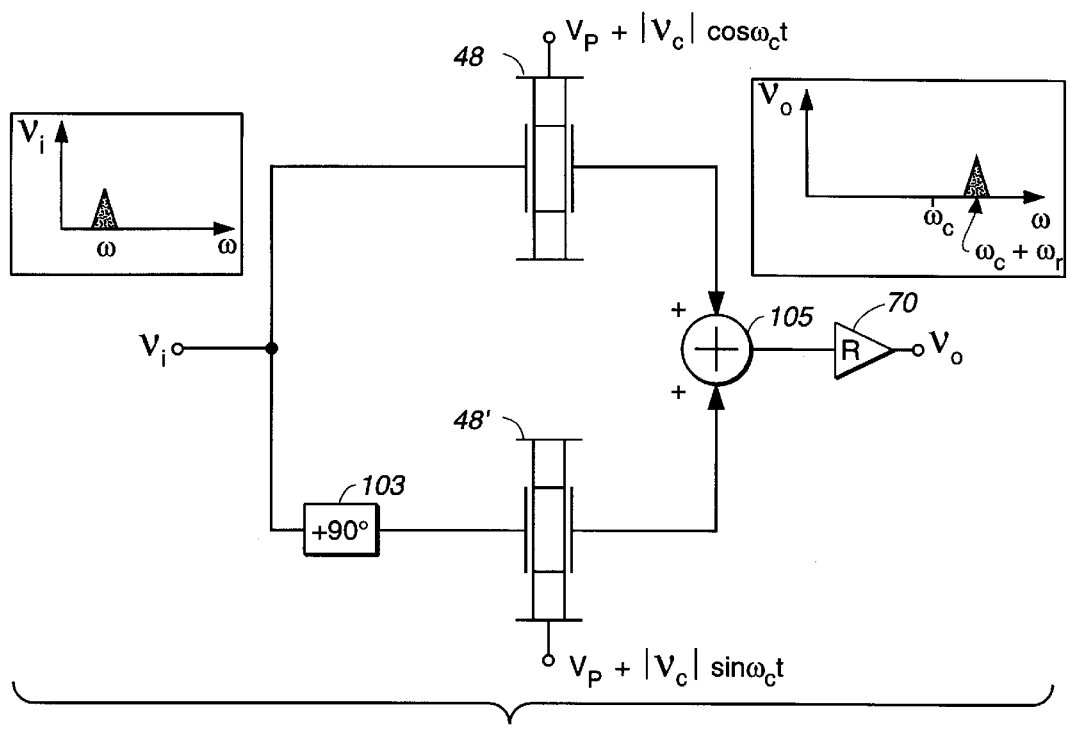
FIG._18
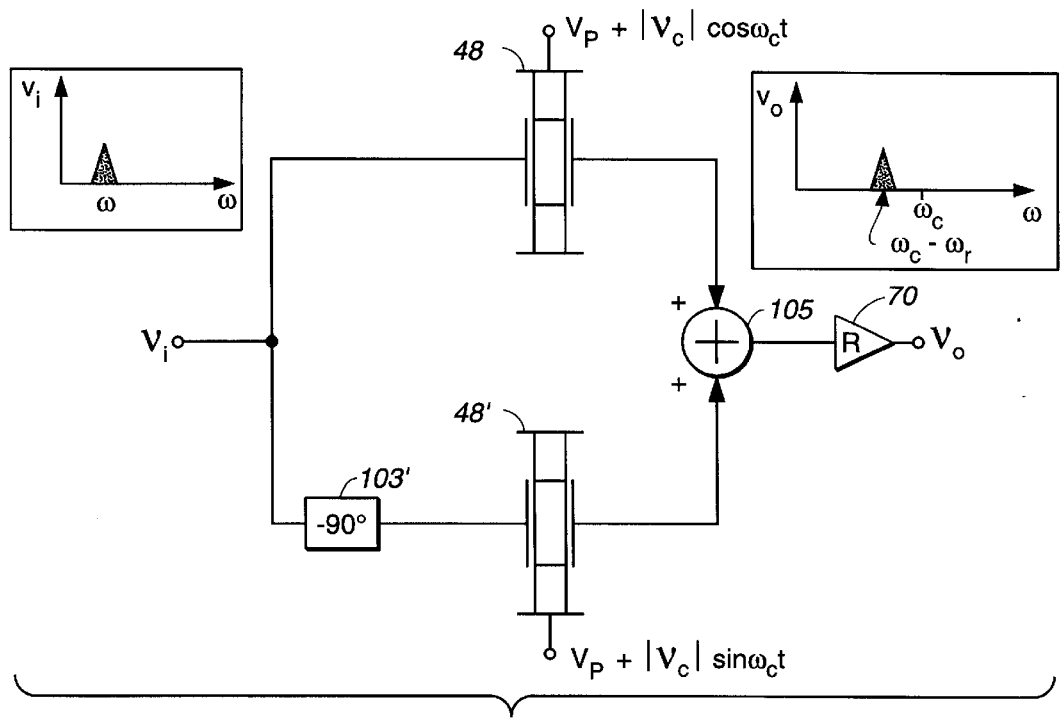
FIG._19

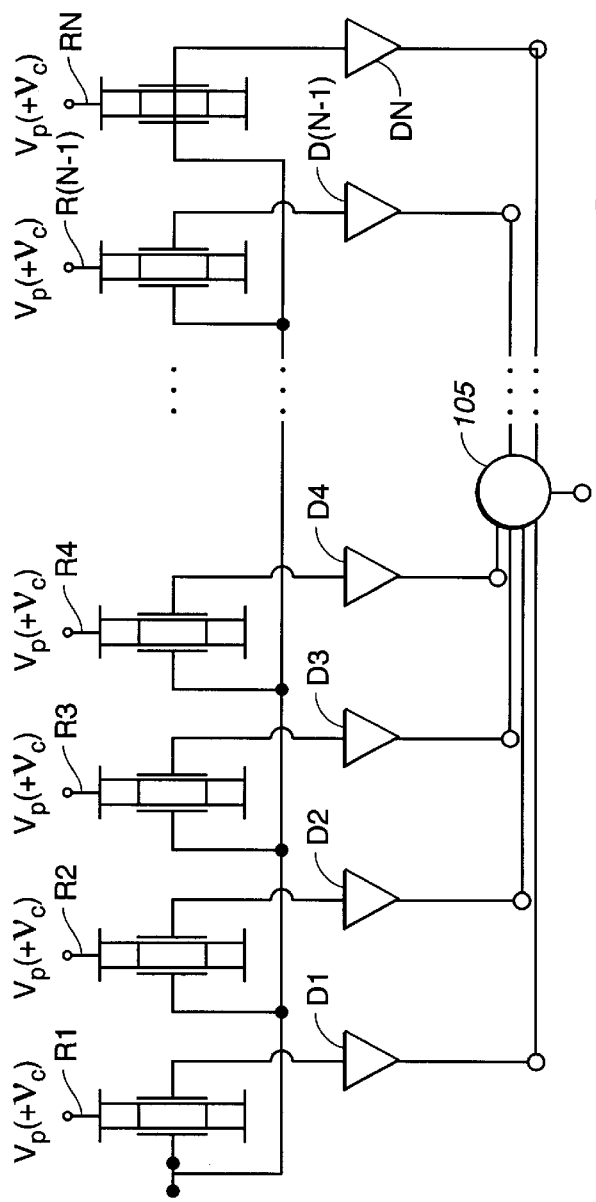
FIG._20A
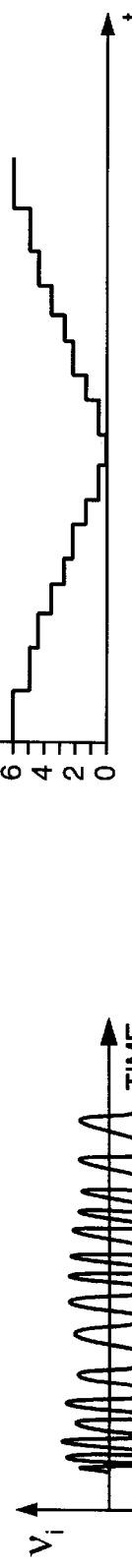
FIG._20B
FIG._20C
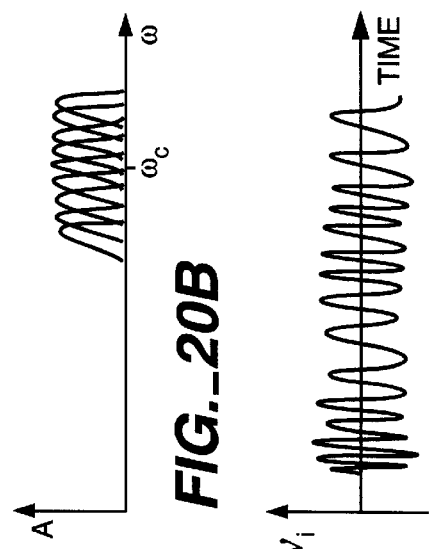
FIG._20D

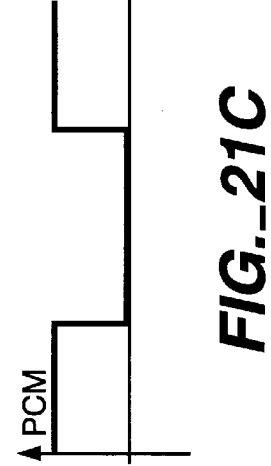
FIG._21C
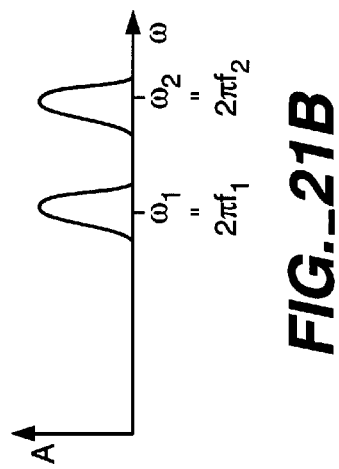
FIG._21B
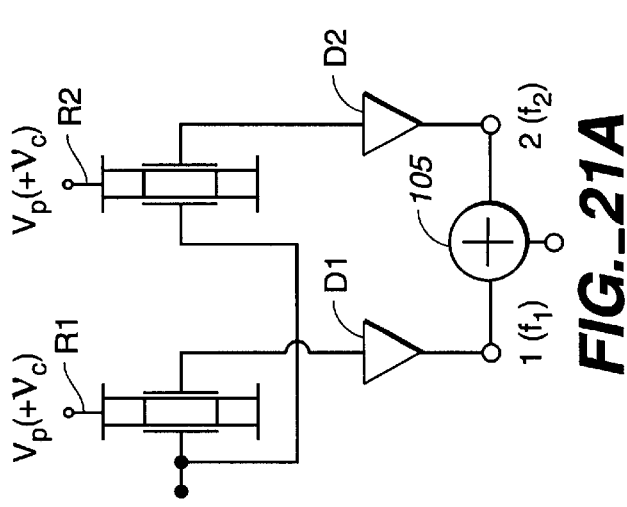
FIG._21A
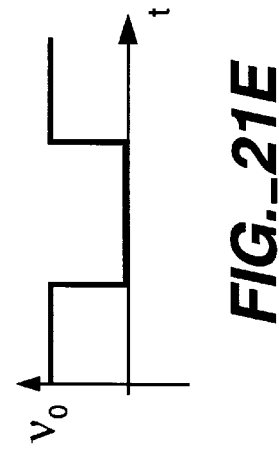
FIG._21E
FIG._21D

MIXING, MODULATION AND DEMODULATION VIA ELECTROMECHANICAL RESONATORS

This invention was made with Government support under Grant (Contract) No. EEC-8614900 awarded by the National Science Foundation. The Government has certain rights to this invention.

BACKGROUND OF THE INVENTION

The present invention relates generally to mixers, modulators and demodulators, and more particularly to integrated micromechanical mixers, modulators and demodulators.

The need for high frequency bandpass filters with high selectivity having applications to telecommunication systems has stimulated interest in integrated versions of such filters, with which whole systems may be integrated onto a single chip. Examples of systems requiring such filters include radio-frequency (RF) receiver systems, mobile/cellular phone networks, and satellite communication systems.

In the above-stated applications, several stages of filtering and mixing (heterodyning) are generally required, as seen in the commercial FM receiver 20 whose schematic block diagram is shown in FIG. 1. Here, the spectrum of FM energy, with information signals ranging in frequency from 88 to 108 MHz, is collected via an antenna 22 and then directed to an RF filter/amplifier 24. As is known, the frequency of a signal may be measured either in cycles per second (Hz), in which case it will be designated using the letter f with a subscript, or in radians per second, in which case it will be designated using the letter ω with a subscript. In general, the frequency selectivity of the RF stage is limited as shown by curve 30 in FIG. 1, because high-Q (quality factor Q in the thousands) bandpass filters with center frequencies ranging from the hundreds of megaHertz to several gigaHertz have been very difficult (very expensive) to implement. Thus, rather than perform the necessary "station" selection at the RF frequency, the information at frequency $f_i$ is mixed (heterodyned) by mixer 26 with the output of a source such as local oscillator 28 at frequency $f_{lo}$ down to an intermediate frequency (IF) $f_c$, where filtering and amplification by IF amplifier 36 is much less expensive. With the above heterodyning procedure, the RF filter need only have enough selectivity to reject image information 32 at a frequency $2(f_{lo}-f_i)=2f_c$ higher than the frequency $f_i$ of the desired information 34 (FIG. 1). The spectrum of the IF amplifier output is shown in graph 23 of FIG. 1. After the amplitude of this signal is rendered constant by limiter 25, it is applied to discriminator 27, whose demodulated output is amplified by audio amplifier 29 and drives speaker 31.

The selectivity of the RF filter, thus, determines the IF frequency $f_c$. If the Q of the RF filter is low enough so that the IF frequency is very large, a second stage of heterodyning with a second IF frequency may be necessary. This is generally the case for very high frequency systems, such as the satellite receiver system 38 shown in FIG. 2, where the RF frequency is in the 1–2 GHz range, the first IF frequency around 400 MHz, and the signal is heterodyned to a second IF frequency, around 10 MHz, by second mixer 42 driven by second local oscillator 40. The resulting signal is applied to second IF amplifier 44 where most of the filtering and amplification takes place. The spectrum of the second IF amplifier output is shown in graph 35 of FIG. 2. Finally, the signal is applied to detector and amplifier 33.

The above heterodyning techniques are necessary, because high-Q bandpass filters with center frequencies ranging from the hundreds of megaHertz to several gigaHertz have been very difficult to implement. Each heterodyning step is accompanied by noise, which reduces the final resolution of the system. In general, for high frequency receiver systems, the higher the RF frequency, the more heterodyning steps required, hence, the lower the resolution. Thus, any reduction in the number of heterodyning steps is desirable.

An object of the present invention is to provide a mixing, modulating or demodulating function using mechanical resonators or filters utilizing mechanical resonators.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a system for mixing, modulation or demodulation comprising a mechanical resonator or filter that may have a nonlinear input transducer such as an interdigitated electrode voltage-to-force transducer.

For mixing or frequency down conversion, a total signal equal to the sum of a modulated input signal, a carrier signal and possibly a DC bias may be applied at the input port of the resonator. A nonlinearity in, for example, the voltage-to-force transduction at the input port(s) of the resonator mixes the input signal with the carrier signal, resulting in a mechanical signal, such as a drive force, at frequencies equal to the sum and the difference between the carrier and the input frequencies. The difference frequency component of the drive force is then filtered by the high-Q frequency characteristic of the resonator or of a filter constructed of resonators, completing the effective mixer and filter function. Using matched mixer and filter devices, a quadrature combination technique can then eliminate the image frequencies resulting from mixing, and a very high frequency receiver system can be implemented with only one heterodyning step.

For up conversion, a micromechanical device may be set in motion by an input modulating signal applied to the input transducer. The resulting variation in, for example, the capacitance of the output transducer is then used to modulate a carrier signal. Using matched devices, a quadrature combination technique can be used to eliminate one of the sidebands to obtain single sideband modulation.

For FM demodulation, a quantized output can be obtained from a parallel bank of relatively narrow-band filters, with or without the mixing described above. This is practical because the mechanical devices used may have very small size and power requirement and can be manufactured in large numbers on a single chip.

The above mixing and filtering function can be achieved with any mechanical resonator-based signal processing device, macroscopic or microscopic. With recent advances in micromachining, the above devices can be integrated on-chip, replacing (in less area) similar functions achieved using traditional, transistor-based technologies, and enhancing the performance of many receiver-like systems by decreasing the number of heterodyning steps required.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 1 is a schematic block diagram of a typical commercial FM receiver, the spectrum of the signal at the output of its RF amplifier, and the spectrum of the signal at the output of its IF amplifier.

FIG. 2 is a schematic block diagram of a typical high frequency satellite receiver, the spectrum of the signal at the output of its RF amplifier, and the spectra of the signals at the outputs of its IF amplifiers.

FIG. 3 is a circuit schematic showing the bias an excitation required to implement a mixer and filter function utilizing a mechanical resonator.

FIG. 4A is a schematic perspective view of the micromechanical filter of the system of FIG. 3.

FIG. 4B is the schematic symbol for the filter of FIG. 4A.

FIGS. 5A and 5B are enlarged views of a portion of the input transducer of the filter of FIG. 3.

FIG. 6 is a plan view of a possible geometry for the micromechanical resonators used in the present invention.

FIG. 7 is an equivalent block diagram schematic for the scheme of FIG. 3.

FIG. 8A shows resonator filtering and mixing applied to a spring coupled electromechanical filter with two electrically connected resonators.

FIG. 8B shows resonator filtering and mixing applied to a spring coupled electromechanical filter with two electrically disconnected resonators.

FIG. 8C shows AM modulation using a spring coupled electromechanical filter with two electrically disconnected resonators.

FIG. 9 is a schematic block diagram of a commercial FM receiver utilizing the present invention, the spectrum of the signal at the output of its RF amplifier, and the spectrum of the signal at the output of its transimpedance amplifier.

FIG. 10 is a schematic block diagram of a satellite receiver utilizing the present invention, the spectrum of the signal at the output of its RF amplifier and the spectra of the signals at the outputs of its two transimpedance amplifiers.

FIG. 11 is a schematic block diagram of a receiver attempting to utilize the present invention in a single heterodyning step.

FIG. 12 is an equivalent block diagram schematic for the scheme of FIG. 11, the spectra of the signals at the input and output of the mixer and the spectrum of the signal at the output of the filter.

FIG. 13 is a schematic block diagram for a quadrature technique for suppression of the upper band image frequency component in the mixer and filter and the spectra of the signals at the input and output of the system.

FIG. 14 is an equivalent block diagram for the system of FIG. 13.

FIG. 15A is a schematic block diagram for a quadrature technique for suppression of the lower band image frequency component in the mixer and filter.

FIG. 15B is an equivalent block diagram for the system of FIG. 15A.

FIG. 16 is a schematic block diagram of a receiver utilizing the present invention in a single heterodyning step.

FIG. 17 is a circuit schematic for a high-Q, very stable oscillator utilizing a micromechanical resonator as a frequency reference FIG. 18 is a schematic block diagram for a quadrature technique for upper sideband AM modulation according to the present invention.

FIG. 19 is a schematic block diagram for a quadrature technique for lower sideband AM modulation according to the present invention.

FIG. 20A is a schematic of an FM demodulator using a bank of mechanical resonator filters.

FIG. 20B is the spectrum of the passbands of the filters of FIG. 20A.

FIG. 20C is a graph of an FM input signal for the demodulator of FIG. 20A.

FIG. 20D is a graph of the demodulated output of the demodulator of FIG. 20A.

FIG. 21A is a schematic of an FSK demodulator using a two-resonator bank of mechanical resonator filters.

FIG. 21B is the spectrum of the passbands of the filters of FIG. 21A.

FIG. 21C is the graph of the PCM signal corresponding to the FSK signal of FIG. 21D.

FIG. 21D is the graph of an FSK modulated signal at the input of the demodulator of FIG. 21A.

FIG. 21E is the graph of the demodulated output of the demodulator of FIG. 21A.

DESCRIPTION OF THE PREFERRED EMBODIMENT

Turning now to the drawings, wherein like components are designated by like reference numerals throughout the various figures, FIG. 3 shows a circuit schematic of a filtering and mixing system 46. In the schematic, a two-port comb-driven micromechanical resonator 48 is shown, with the understanding that any mechanical resonator, with any number of ports, may be used in place of the shown resonator.

The system of FIG. 3 has an input port with terminals 50 and 52 where the modulated signal $v_i$ from source 54 is applied, and an output port with terminals 56 and 52 through which mixed and filtered output signal $v_o$ can be applied to a load. The electromechanical filter 48, comprising mechanical filter 58 bridging input transducer 60 and output transducer 62, is biased using DC source 64 and an AC source such as a local oscillator 66 such that the sum of input signal $v_i$, local oscillator output $v_c$ and DC bias voltage $V_P$ is applied at the input of filter 48, between nodes 50 and 68.

It should be noted that there is no restriction on the phases of the input signals. In other words, subtraction as well as addition is possible. Also, the modulated and carrier signals may be combined using arrangements other than the series connection of their sources shown in FIG. 3. For example, if the sources of the signals have high impedance, a parallel rather than a series connection may be preferable.

Each transducer comprises two members movable relative to each other. Filters that can be used to practice the present invention can be synthesized, for example, using resonators disclosed in U.S. Pat. No. 5,025,346 dated Jun. 18, 1991, which is incorporated herein by reference. A transimpedance amplifier 70 is connected between the output 72 of filter 48 and demodulator output 56. The mixing is done by input transducer 60 and the filtering by mechanical filter 58.

FIG. 4A is a perspective view of micromechanical resonator 48. Input and output terminals 50 and 72 are connected to fixed comb drive and sense electrodes 74 with suspended fingers 76 and 78. Suspended plate 80 is electrically connected, through folded beam suspension 82 and 84, and anchors 86, to ground plane 88 and terminal 68. Plate 80 has comb structures with fingers 90 and 92 interdigitated with the fingers of the fixed electrodes. A schematic symbol for the entire structure, showing terminals 68, 50 and 72, is given in FIG. 4B.

FIG. 5A is an enlargement of a portion of the comb structure of input transducer 60 in FIGS. 3 and 4A. It shows two stationary electrode fingers 94 and 96 and a movable finger 98. The electric field lines between the movable finger 98 and the stationary electrodes 94 and 96 are also shown. FIG. 5B shows finger 98 after a displacement of Δx through the slot between electrodes 94 and 96. The other fingers in FIGS. 3 and 4A operate similarly. It can be readily seen from FIGS. 5A and 5B that the capacitance of structure 60 depends linearly on the finger displacement Δx but this is not a necessary condition for the practice of the present invention. When a constant voltage is applied between the two electrodes of structure 60, the electrostatic force between the electrodes is the derivative of the electrostatic energy with respect to the position x. For the electrode shape shown in FIGS. 5A and 5B, the force is found to be independent of position and proportional to the square of the voltage. The force is therefore a nonlinear function of the voltage. If the voltage across the electrodes of transducer 60 is used to characterize its input and the electrostatic force developed between the electrodes is used to characterize its output, it can be seen that the transducer has a nonlinearity. This is the only condition input transducer 60 must satisfy for the practice of heterodyning according to the present invention. It will be appreciated that a wide variety of transducers can be used within the scope of the invention.

The force between electrode 74 and plate 80 drives the plate (see FIG. 4). Note that in this particular embodiment, plate 80 is part of filter 58 as well as of input and output transducers 60 and 62. In the embodiment described, the output or response of the filter is the speed of motion of plate 80. Output transducer 62 converts this signal to a current, which is the output of the electromechanical device 48. In addition to forming part of the input and output transducers, electrodes 74, together with ground plane 88, levitate plate 80 in a balanced fashion. Transimpedance amplifier 70 provides an output signal $v_o$ of the system of FIG. 3 which is proportional to the current at the output of transducer 62 but with an output impedance suitable for driving the intended load of the system. Note that the carrier signal and other components also appear at the output of transducer 62, and should be attenuated by the roll off of transimpedance amplifier 70. In other words, transimpedance amplifier 70 should be designed so that its passband includes the frequency of oscillation of plate 80 but not the carrier frequency.

The electromechanical device of FIG. 4, used in this discussion, is a member of a large class of electromechanical filters with nonlinear input transducers, other examples of which are shown in FIGS. 6 and 8A–8B. The serpentine ring torsional structure 63 of FIG. 6 is disclosed in above-mentioned U.S. Pat. No. 5,025,346 dated Jun. 18, 1991. Other such filters can be synthesized from a plurality of resonators with or without electrical feedback as disclosed in co-pending U.S. patent applications Ser. No. 07/990,582, now U.S. Pat. No. 5,537,083, and Ser. No. 07/989,396, now U.S. Pat. No. 5,491,604. The preferred embodiment of the present invention uses these more elaborate electromechanical filters in those applications which require a frequency response that cannot be obtained using a single resonator. A simple example are the structures of FIGS. 8A–8B which have an additional spring-coupled resonator. The systems of FIGS. 8A–8B are similar to that of FIG. 3 except that in this case the micromechanical filter comprises two resonators 100 and 102 coupled by coupling spring 104 or 104'. Resonators 100 and 102 of FIGS. 8A–8C have only one transducer each, but have fingers and fixed electrodes on two sides in order to balance plates 80 and 80'. Differential drive and sense are also possible through the additional electrodes. In FIG. 8A, coupling spring 104 is electrically conductive. Resonators 100 and 102 are therefore electrically connected, and the same biasing circuitry, comprising AC sources 54 and 66 and DC source 64, is used for both resonators. In FIGS. 8B and 8C, coupling spring 104' is electrically insulating. Here, resonator 102 may have separate biasing circuitry such as, for example, DC source 64' for levitating plate 80'.

The key feature in FIG. 3 is the ac signal, $v_c$ (on top of a dc-bias, $V_p$) applied to the movable plate of mechanical resonator 48. Application of $v_c$ effectively moves the bandpass of the resonator up to frequencies around the carrier frequency, which can be chosen very high, in the megaHertz or gigaHertz range.

This phenomenon comes about because the proper combination of carrier and excitation signals, $v_c$ and $v_i$, respectively, can give rise to force components near the center frequency of the resonator. With the excitation configuration of FIG. 3, the drive force $f_d$ can be found to have components at dc and at frequencies $2\omega_i$, $2\omega_c$, $\omega_i$, $\omega_c$, $\omega_c-\omega_i$ and $\omega_c+\omega_i$, where $\omega_i$ is the frequency of the excitation signal and $\omega_c$ is the frequency of the carrier signal, because the force is proportional to the square of the input voltage. Assuming a reasonably large quality factor, the force components which will excite resonance are those close to the resonance frequency, $\omega_r$.

Such a component may arise when $\omega_i=\omega_r$, which is the bias and excitation scheme previously used for mechanical resonators. Such a component may also arise when $\omega_i=\omega_c\pm\omega_r$ and it is this case that is used in the present invention. When the drive signal has frequency approaching $\omega_c\pm\omega_r$, a drive force $f_d$ with frequency approaching $\omega_r$ arises, and the resonator oscillates around its resonance frequency, $\omega_r$. In other words, the resonator is driven by a signal at frequency $\omega_c\pm\omega_r$, but oscillates (and provides an output signal) at frequency $\omega_r$, which can be an IF frequency. In effect, a signal at frequency $\omega_c\pm\omega_r$ can be mixed down to IF and filtered using a single resonator in the configuration of FIG. 3. FIG. 7 explicitly shows the equivalence between the resonator configuration of FIG. 3 and a mixer and filter function in block diagram form. The input signal is mixed with a local oscillator signal by the nonlinearity of the input transducer represented here as mixer 8. This is followed by filtering by the resonator, represented here as filter 99. Note that two frequency components are collected, one of which may be an undesirable image.

The above theory has been developed using a single resonator. However, it also applies to any resonator system, such as spring-coupled micromechanical resonator filters as described in U.S. patent application Ser. No. 07/990,582 or Q-controlled microresonator filters as described in U.S. patent application Ser. No. 07/989,396. An explicit excitation and bias configuration for the case of the spring-coupled mechanical filters is shown in FIGS. 8A and 8B. For the case of electrically or mechanically coupled resonator filters, the above mixing and filtering function can be achieved by applying the carrier frequency to at least the resonator 100 closest to the input.

The above mixer and filter device, as shown in FIG. 3, can be used to replace the mixer 26 and IF amplifier 36 in the receiver system of FIG. 1 by a resonator or filter 48 and a transimpedance amplifier 70, as shown in the receiver system 20' of FIG. 9. Here, the passband of the RF amplifier may be 88–108 MHz the center frequency of the resonator may be 10.7 MHz. For the case of the high frequency receiver, the system of FIG. 2 can be implemented using the present invention as shown in FIG. 10, where the original IF stages with mixers 26 and 42 and IF amplifiers and filters 36 and 44 have been replaced by electromechanical mixer and filter versions using resonators or filters 48, 48' and transimpedance amplifiers 70 and 70'. Here, the passband of the RF amplifier may be 1–2 GHz, the center frequency of the first resonator may be 200 MHz and the center frequency of the second resonator may be 10 MHz.

As has been discussed, the noise performance of both of these systems can be improved by replacing all amplifiers, RF and IF, by a single electromechanical mixer and filter device, as shown in FIG. 11, where the frequency of local oscillator 28 may be 1–2 GHz±10 MHz, and the center frequency of resonator 48 may be 10 MHz. The system shown also includes a dc source 64, transimpedance amplifier 70 and detector and amplifier 33. The problem with doing this is that the image frequency, as well as the desired information frequency, will reach the output of the resonator, as shown in FIG. 12. Here, the local oscillator frequency is $\omega_c$, the center frequency for resonator filtering is $\omega_r$, the desired information 34 is at frequency $\omega_c-\omega_r$ and the 30 image information 32 is at frequency $\omega_c+\omega_r$. Both the information frequency signal and the image frequency signal appear at the output of mixer 8. Thus, a mechanism which suppresses the image frequency is required.

FIG. 13 presents one scheme by which image suppression can be achieved. Here, the input signal is applied to two electromechanical mixers and filters 48, 48' in parallel. The two devices are identical in construction and in passband response, but operate slightly differently in that their applied carrier signals are 90° out of phase. This may be accomplished by using synchronized local oscillators or a local oscillator and a phase shifter. The output of the sine carrier mixer and filter then goes through a 90° phase shifter 103 after which it is summed with the output of the cosine carrier mixer and filter by summer 105. As a result, the upper sideband has been suppressed.

From a block diagram point of view, the system of FIG. 13 is equivalent to FIG. 14, where the mixing and filtering order has been reversed (but system equivalency retained) to show the suppression more clearly. Note that the image frequency noise, which would occur a frequency $\omega_r$ higher than the carrier frequency $\omega_c$ is now suppressed. To collect information at the higher frequency and suppress the lower frequency image, the system of FIG. 15A may be used. This system differs from that of FIG. 13 in the sign of the phase shift produced by phase shifter 103'. FIG. 15B is an equivalent block diagram of the system of FIG. 15A with the center frequency of filter 99 being $\omega_{c+\omega_r}$. Using the image suppression scheme of FIG. 13, a feasible single-heterodyne high frequency receiver system would then appear as in FIG. 16. The center frequencies of the two resonators may be 10 MHz.

The high-Q, very stable local oscillator for this mixer and filter application can be implemented utilizing a micromechanical resonator embedded in a positive feedback loop. Several oscillator topologies are available for this purpose, such as the one presented in FIG. 17, where the resonator operates in series resonant mode. Parallel resonant oscillators are also feasible, including the popular Pierce design.

The sustaining amplifier 106 in the design of FIG. 17 is transresistance, using shunt-shunt feedback to achieve a low input resistance, and therefore minimal Q-loading. The amplifier comprises MOS field effect transistors designated $m_1$ to $M_7$. $M_4$ and $M_5$ serve as replica biasing for gain stages $M_1$–$M_2$ and $M_6$–$M_7$. $M_3$ is usually biased in the linear region (sometimes in weak inversion) by control voltage $V_{GC}$ and serves as an MOS resistor. To insure start-up of oscillation, the gain of the transresistance amplifier should be chosen three or more times larger than the effective series resistance of the microresonator. The output of the resonator is amplified by output amplifier 108 comprising MOS field effect transistors $M_8$–$M_{19}$. Even higher frequency high-Q oscillators can be implemented using frequency multiplication, which may be phase-locked multiplication.

The operation of the system as an amplitude modulator is described with reference to FIG. 3. The input signal may be a signal $v_i$ that should be within the passband of the resonator. The resonator moves in response to this signal being applied to input transducer 60. A DC bias and the carrier signal $v_c$ are applied to the movable plate of resonator 58. The amplitude of the sense current near the carrier frequency depends on the instantaneous value of the capacitance of output transducer 62, which varies as the resonator moves in response to the low frequency input signal. As a result, the carrier signal is double sideband modulated by the input signal. In this case, the carrier frequency should be within the passband of transimpedance amplifier 70, in contrast with the requirements for downconversion. Single sideband modulation can be accomplished similar to the image suppression described above, using two matched resonators connected as shown in FIGS. 18 and 19.

Upper sideband modulation may be achieved as shown in FIG. 18. Here, the input signal is applied to two electromechanical filters 48, 48' in parallel but with a 90° phase difference due to phase shifter 103.

Electromechanical filters 48 and 48' are identical in construction and in passband response, but operate slightly differently in that their applied carrier signals are 90° out of phase. The output of the sine carrier filter is summed with the output of the cosine carrier filter by summer 105. If the signals summed by summer 105 are currents, summer 105 may simply be a node. The output of summer 105 is then applied to transimpedance amplifier 70. To achieve lower sideband modulation, the system of FIG. 19 may be used. This system differs from that of FIG. 18 in the sign of the phase shift produced by phase shifter 103'. As in the case of heterodyning described before, a wide variety of electromechanical filters can be used, with the difference that in this case the carrier signal should be applied to the resonator closest to the output transducer. In the example of FIG. 8C, the carrier signal is applied to resonator 102 by way of anchors 86, and bias DC source 64' does not affect the modulated output but may be used to help levitate plate 80'.

By using a parallel bank of mechanical resonators R1–RN as shown in FIG. 20A with passbands spanning a frequency range as shown in FIG. 20B, or a parallel bank of filters constructed from such resonators, an FM signal can be demodulated using the scheme shown in FIGS. 20A–D. An FM signal such as the one shown in FIG. 20C is applied to the input of each resonator in the parallel bank shown in FIG. 20A. Here, each resonator outputs a response when the frequency of the FM signal traverses its frequency band. The output of each resonator may then be applied to a detector D1–DN as shown in FIG. 20A, the outputs of the detectors providing the demodulated signal in a decoded form. In other words, the outputs of detectors D1–DN are activated one at a time, and correspond to different values of the output signal. Each detector output can be weighted and combined with the others, for example by a summer 105, thus generating a demodulated output in a quantized form, shown in FIG. 20D.

The above system can be simplified to, for example, a two-resonator (or two-mechanical filter) system for demodulation of frequency-shift keyed signals using two keyed frequencies. This is depicted in FIGS. 21A–E. FIG. 21A is a schematic of the demodulating system, comprising resonators or filters R1–2, detectors D1–2 and summer 105. The passbands of the two filters R1 and R2 are shown in FIG. 21B. FIG. 21C is a graph of the initial PCM signal and FIG. 21D is a graph of the FSK signal modulated by the signal of FIG. 21C. The output of each resonator may then be applied to a detector D1–2 as shown in FIG. 21A, the outputs of the detectors providing the demodulated signal in a decoded form. Each filter output can be weighted and summed with the other thus generating a demodulated output in a quantized, sampled and held form as shown in FIG. 21E.

For the above demodulation schemes, the frequency range can be increased by using the carrier frequency mixing schemes of the previous section in this disclosure. The systems of FIGS. 20A and 21A can be so used by connecting a local oscillator to the movable plates of the resonators using the biasing scheme of FIG. 3. As a result, there will be an output signal when the frequency of the input signal is higher than a frequency within the passband of the filter by an amount equal to the frequency of the local oscillator.

In summary, an apparatus and method for mixing, heterodyning, AM, FM and FSK demodulation and AM modulation have been described.

The present invention has been described in terms of a preferred embodiment. The invention, however, is not limited to the embodiment depicted and described. Rather, the scope of the invention is defined by the appended claims.

What is claimed is:

1. An apparatus comprising:
   a first electromechanical filter having a nonlinear input transducer;
   means for driving said input transducer of said first electromechanical filter with a first electrical input signal having AC components comprised of a carrier signal and an excitation signal;
   wherein said input transducer of said first electromechanical filter is driven by said electrical input signal and a passband of said first electromechanical filter includes a difference frequency between a center frequency of said carrier signal and a center frequency of said excitation signals;
   a second electromechanical filter matched to said first electromechanical filter and having a nonlinear input transducer;
   means for driving said input transducer of said second electromechanical filter with a second input signal having AC components comprised of said carrier signal phase shifted by 90° and said excitation signal;
   a phase shifter for shifting the phase of an output signal of said second electromechanical filter by one of 90° and −90°; and
   a summer for summing an output signal of said phase shifter with an output signal of said first electromechanical filter.

2. The apparatus of claim 1 further comprising a local oscillator for producing said carrier signal.

3. The apparatus of claim 1 wherein said input transducer of said first electromechanical filter is selected from the group consisting of electrostatic piezoelectric, piezoresistive and magnetic transducers.

4. The apparatus of claim 1 wherein said input transducer of said first electromechanical filter comprises two electrostatically coupled electrodes.

5. The apparatus of claim 4 wherein said electrostatically coupled electrodes are patterned to provide for each at least one comb with fingers interdigitated with those of the other.

6. An apparatus comprising:
   a first member of an input transducer;
   a second member of said input transducer movable relative to said first member;
   a first member of an output transducer;
   a second member of said output transducer movable relative to said first member of said output transducer and coupled to said second member of said input transducer to form an electromechanical filter having a passband; and
   means for providing an electrical input signal having AC components comprised of a carrier signal and an excitation signal to said input transducer; and wherein
   said second member of said input transducer is driven relative to said first member of said input transducer by a mechanical signal which is a nonlinear function of said electrical input signal; and
   a passband of said filter includes a difference frequency between a center frequency of said carrier signal and a center frequency of said excitation signal.

7. The apparatus of claim 6 further comprising a local oscillator for producing said carrier signal.

8. The apparatus of claim 6 wherein said first and second members of said input transducer and said first and second members of said output transducer are electrostatically coupled electrodes.

9. The apparatus of claim 8 wherein said electrostatically coupled electrodes are patterned to provide for each at least one comb with fingers interdigitated with those of the other.

10. The apparatus of claim 8 further comprising a transimpedance amplifier connected to said output transducer.

11. An apparatus comprising:
    a first electromechanical filter having an input transducer and a passband;
    an AC source for driving said input transducer of said first electromechanical filter with a carrier signal and an excitation signal;
    a second electromechanical filter matched to said first electromechanical filter and having an input transducer;
    an AC source for driving said input transducer of said second electromechanical filter with said carrier signal phase shifted by 90° and said excitation signal shifted by 90°; and
    a summer for summing an output signal of said second electromechanical filter with an output signal of said first electromechanical filter.

12. A method for mixing a carrier signal and an excitation signal comprising the steps of:
    providing an electrical input signal having AC components comprised of said carrier signal and said excitation signal;
    applying said electrical input signal to an electromechanical filter having a nonlinear input transducer, said filter having a passband including a difference frequency between a center frequency of said carrier signal and a center frequency of said excitation signal;

wherein said input transducer comprises two electrostatically coupled electrodes that are patterned to provide for each at least one comb with fingers interdigitated with those of the other; and applying the output of the electromechanical filter to a matched electromechanical filter with a non-linear input transducer patterned to provide at least one comb with interdigitated fingers.

13. The method of claim 12 wherein said input transducer is selected from the group consisting of electrostatic, piezoelectric, piezoresistive and magnetic transducers.

14. An apparatus, comprising:

an electromechanical filter having a nonlinear input transducer, said nonlinear input transducer including two electrostatically coupled electrodes that are patterned to provide for each at least one comb with fingers interdigitated with those of the other;

an oscillator for driving said nonlinear input transducer with a first electrical input signal having AC components comprised of a carrier signal and an excitation signal; wherein said nonlinear input transducer is driven by said electrical input signal and a passband of said filter includes a difference frequency between a center frequency of said carrier signal and a center frequency of said excitation signal to provide for mixing of said carrier signal and said excitation signal; and a second electromechanical filter having a second non-linear input transducer, said second electromechanical filter matched with and coupled to said first electromechanical filter, said second non-linear input transducer patterned to provide at least one comb with interdigitated fingers.

15. A method of mixing and filtering an RF signal by an electromechanical resonator having a resonance frequency, comprising:

applying the RF signal and a carrier signal to a nonlinear input transducer of the electromechanical resonator;

receiving an output signal on an output of the electromechanical resonator, said output signal including a signal with a frequency equal to the difference between a center frequency of the RF signal and a center frequency of the carrier signal; and applying the output of the electromechanical resonator to a matched electromechanical filter with a non-linear input transducer patterned to provide at least one comb with interdigitated fingers.

* * * * *